United States Patent [19]
Pierrat

[11] Patent Number: 5,582,939
[45] Date of Patent: Dec. 10, 1996

[54] METHOD FOR FABRICATING AND USING DEFECT-FREE PHASE SHIFTING MASKS

[75] Inventor: Christophe Pierrat, Boise, Id.

[73] Assignee: Micron Technology, Inc., Boise, Id.

[21] Appl. No.: 500,481

[22] Filed: Jul. 10, 1995

[51] Int. Cl.$^6$ ........................................... G03F 9/00
[52] U.S. Cl. ........................... 430/5; 430/322; 430/324; 216/47; 216/48; 216/67
[58] Field of Search ........................... 430/5, 322, 323, 430/324; 156/646, 652

[56] References Cited

U.S. PATENT DOCUMENTS

| | | | |
|---|---|---|---|
| 4,906,326 | 3/1990 | Amemiya et al. | 156/626 |
| 5,085,957 | 2/1992 | Hosono | 430/5 |
| 5,382,483 | 1/1995 | Young | 430/5 |
| 5,382,484 | 1/1995 | Hosono | 430/5 |
| 5,405,721 | 4/1995 | Pierrat | 430/5 |

OTHER PUBLICATIONS

"Phase–Shifting Mask Fabrication", E. Pierrat et al., *Photomask Technology and Management* (1993) SPIE vol. 2087.

*Primary Examiner*—S. Rosasco
*Attorney, Agent, or Firm*—Stephen A. Gratton

[57] ABSTRACT

A method for forming a defect-free phase shift mask includes forming a mask blank having a substrate, an etch stop layer, a phase shift layer and an opaque layer. The etch stop layer and phase shift layer are formed of chemically different materials to allow selective etching and end point detection. Initially the opaque layer is patterned and etched using a process such as e-beam lithography. Then the phase shift layer is patterned and etched using the etch stop layer as an end point. Bump defects formed in phase shift areas are then removed by exposing a resist layer to leave the phase shifters, or alternately just the defects, unprotected. During defect etching, the etch stop layer can again be used to endpoint the etch process. The etch stop layer can also be formed as a phase shift layer to permit removal of indentation defects using a process such as ion milling.

35 Claims, 6 Drawing Sheets

FIGURE 5A
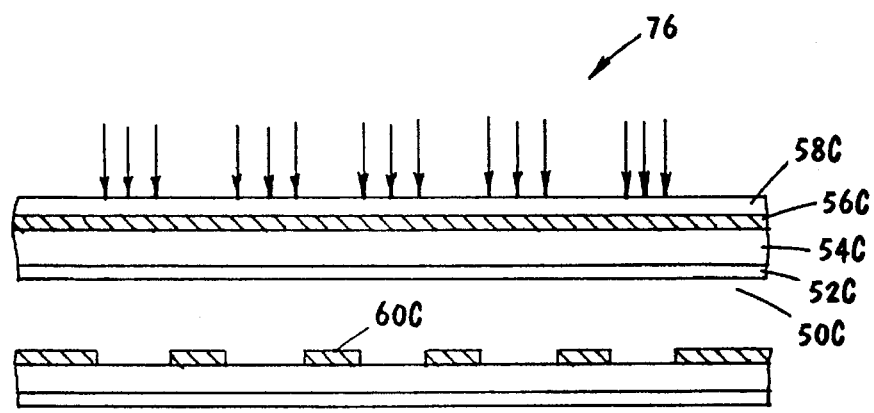
FIGURE 5B
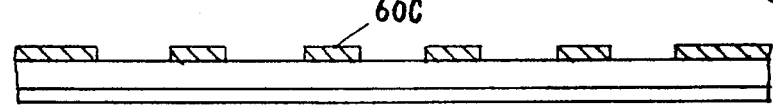
FIGURE 5C
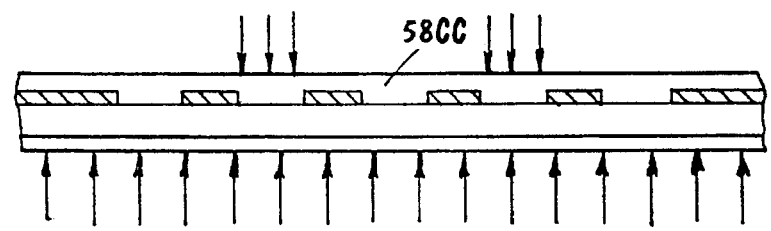
FIGURE 5D
FIGURE 5E
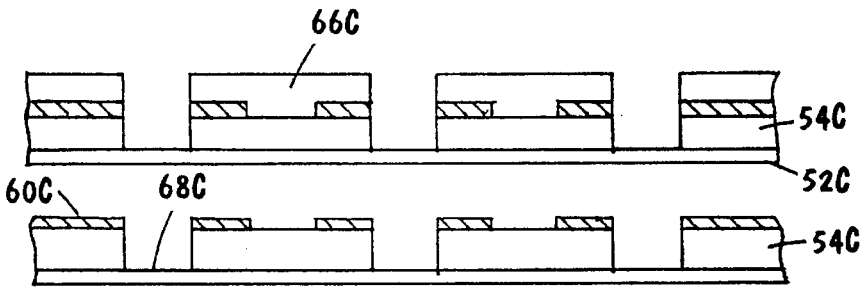

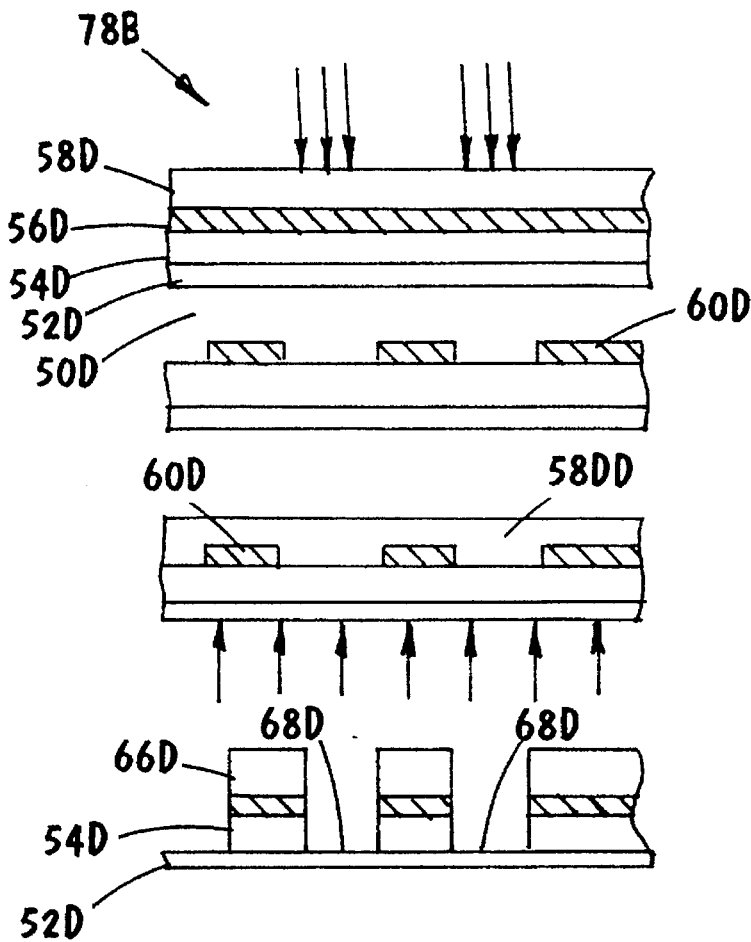
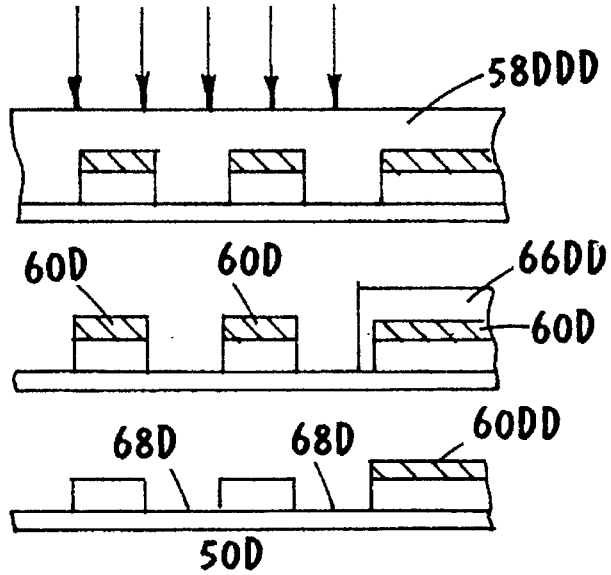
FIGURE 6A
FIGURE 6B
FIGURE 6C
FIGURE 6D
FIGURE 6E
FIGURE 6F
FIGURE 6G

5,582,939

METHOD FOR FABRICATING AND USING DEFECT-FREE PHASE SHIFTING MASKS

This invention was made with Government support under Contract No. MDA972-92-C-0054 awarded by Advanced Research Projects Agency (ARPA). The Government has certain rights in this invention.

FIELD OF THE INVENTION

This invention relates to lithography and more particularly to the fabrication of masks which are used in lithography. The method of the invention is particularly suited to fabricating and using phase shifting masks for semiconductor manufacture.

BACKGROUND OF THE INVENTION

In lithography, an exposure energy, such as ultraviolet light, is passed through a mask and onto a target such as a silicon wafer. The mask contains opaque and transparent regions formed in a predetermined pattern. The exposure energy exposes the mask pattern on a layer of resist formed on the target. The resist is then developed for removing either the exposed portions of resist for a positive resist or the unexposed portions of resist for a negative resist. This forms a resist mask. The resist mask can then be used in subsequent fabrication processes. In semiconductor manufacture such a resist mask can be used in deposition, etching, or ion implantation processes, to form integrated circuits having very small features.

One technique used in lithography is known as phase shift lithography. With phase shift lithography, the interference between waves of an exposure energy is used to overcome diffraction and improve the resolution and depth of the images projected onto the target. In phase shift lithography, the phase of the exposure energy at the target is controlled such that adjacent bright areas are formed preferably 180 ($\pi$) degrees out of phase with one another. Dark regions are thus produced between the bright areas by destructive interference. This technique improves total resolution at the target and allows resolutions as fine as 0.10 μm to occur.

In the past, phase shift masks have been used experimentally to print sub micron features. However, phase shift lithography is still in research and development stages and has not been used extensively for commercial volume semiconductor manufacture. One reason phase shift lithography is not widely used commercially, is the high defect density which results during its use. In general, phase shift masks are difficult to form without defects and any defects on the mask pattern can be printed onto the target.

In general there are two types of defects: bump defects and indentation defects. A bump defect comprises unwanted material that has been deposited or not removed from a region of the mask. For example, a metal bump defect, comprising chromium or another material used in forming an opaque layer can remain after the opaque layer is etched. The bump defect can also be formed of an inorganic material such as silicon dioxide ($SiO_2$) used in forming a phase shift layer. An indentation defect comprises an area of the mask that has been undesirably removed such as by etching. With either type of defect, the defect can cause printing errors on a target such as a semiconductor wafer.

This has led to the development of methods for eliminating defects from a phase shifting masks. One such method is described in U.S. Pat. No. 5,405,721 to Pierrat, which is incorporated herein by reference. In this method an opaque layer and two different phase shift layers are formed on the mask. The opaque layer and top phase shift layer are patterned in a conventional manner and the bottom phase shift layer is patterned only to repair missing shifter defects. However, the main purpose of the bottom phase shift layer is to provide an etch stop during repair of the phase defects or during the fabrication of the mask.

The method disclosed in the above Pierrat patent is illustrated for forming an alternating aperture mask in FIGS. 1 and 2. In FIG. 1, a mask blank 8 includes: a transparent substrate 10; a bottom phase shift layer 12, a top phase shift layer 14 and an opaque layer 16. Each of the phase shift layers 12 and 14 are formed of a material having an index of refraction and a thickness to provide a combined phase shift of $2\pi$ or even integral multiple thereof (i.e., $2p\pi$ where p is an integer). The additive effect of the two phase shift layers 12 and 14 is thus equivalent to no phase shift. However, the phase shift layers 12 and 14 are formed of different materials to permit selective etching to remove defects. The top phase shift layer 14 can be made of a conventional phase shift material such as $SiO_2$ whereas the bottom phase shift layer 12 can be made of a material that provides an etch stop during defect etching. For example, for a top phase shift layer 14 formed of $SiO_2$ and a substrate 10 formed of quartz, the bottom phase shift layer 12 can be a fluoride such as $MgF_2$, $CaF_2$, $YF_3$, $LaF_3$.

Using a blank 8 formed as shown in FIG. 1, different types of phase shift masks can be fabricated (e.g., alternating aperture phase shift mask, rim phase shift mask, chromeless phase shift mask). Referring to FIG. 2, for fabricating an alternating aperture phase shift mask 17, the opaque layer 16 can be patterned and etched to form opaque light blockers 18. The top phase shift layer 14 can be patterned and etched to form an alternating pattern of phase shifters 20 and light transmission openings 22. Exposure energy directed through a phase shifter 20 is phase shifted by $\pi$ (or odd multiple thereof) relative to exposure energy directed through a light transmission opening 22.

An indentation defect 26 comprises an etched trench in one of the light transmission openings 22. In order to remove the indentation defect 26, a gallium ion beam is focused on the region wherein the indentation defect 26 is located. The ion beam forms by ion milling a recess 28 (indicated by dotted lines) that extends through both phase shift layers 12 and 14 to the substrate 10. The ion milling process is terminated as soon as chemical by-products, or secondary ions, resulting from the ion beam contacting the substrate 10 are detected. In use of the phase shift mask 17, the recess 28 does not phase shift the exposure energy. Accordingly, there is still a phase difference of $\pi$ for exposure energy directed through a recess 28 relative to exposure energy directed through a phase shifter 20.

A bump defect 24 comprises excess material left in a phase shifter 20. In this case the excess material can be the same material as the top phase shift layer 14 (e.g., $SiO_2$). To remove the bump defect 24, the focused gallium ion beam is directed at the bump defect 24. The ion milling is terminated as soon as the detected by-products begin to shift from those known to be emitted by the material which forms the top phase shift layer 14 to those known to be emitted by the material which forms the bottom phase shift layer 12 (e.g., $MgF_2$, $CaF_2$, $YF_3$, $LaF_3$.).

With this method the ion beam may stain the area of the bottom phase shift layer 12 subjacent to the bump defect 24. In a similar manner, the ion beam may stain the area of the substrate 10 subjacent to the indentation defect 26. These stains can be removed by etching the stained areas on the substrate 10 and bottom phase shift layer 12 by an amount that can be precisely ascertained using equations that take into account the index of refraction of the different materials.

One shortcoming of this method for removing defects in a phase shift mask is that the ion milling process can be difficult to perform and control. In particular it can be difficult to precisely align and focus the gallium ion beam to the areas containing the defects. At best, this can be a time consuming process and requires expensive ion milling equipment. In addition, the subsequent stain removal process can also be difficult to perform and adds complexity to the process.

Because of these and other shortcomings in the art, there is a need for an improved method for fabricating defect-free phase shift masks. Accordingly, it is an object of the present invention to provide an improved method for fabricating defect-free phase shift masks.

It is another object of the present invention to provide an improved method for fabricating and using defect-free phase shift masks in high volume semiconductor manufacture.

It is yet another object of the present invention to provide an improved defect-free phase shift mask.

Other objects, advantages and capabilities of the present invention will become more apparent as the description proceeds.

SUMMARY OF THE INVENTION

In accordance with the present invention, an improved method for fabricating and using a defect-free phase shift mask are provided. The method of the invention forms a mask blank that includes a transparent substrate, an etch stop layer, a phase shift layer and an opaque layer. The opaque layer is patterned and etched to form opaque light blockers and the phase shift layer is patterned and etched to form phase shifters. The thickness and index of refraction of the phase shift layer are selected to achieve a predetermined phase shift (e.g., $\pi$).

Preferably, electron beam lithography is used to pattern the opaque layer and to pattern the phase shift layer. Following formation of the phase shift layer, a dry etch step is performed to remove bump defects present on the phase shifters. The dry etch step can be performed using electron beam lithography by exposing a layer of resist to leave the phase shift areas unprotected for dry etching. Alternately just the defects can be left unprotected by exposure using a mask writer or mask repair tool. Preferably the dry etch step is performed anisotropically to avoid undercutting the pattern of phase shifters. During the dry etch step the etch stop layer forms an etch stop.

The etch stop layer is formed of a transparent material that is chemically different than the phase shift layer. Accordingly, emission of chemical by-product species from the etch stop layer can be detected in the plasma used during the dry etch step. In addition, the etch stop layer is formed of a low absorption material having a refractive index that closely matches that of the substrate.

The above described method will remove bump defects from the phase shifters. Optionally, indentation defects on other portions of the mask can be removed using a focused ion beam. In this case the etch stop layer must be formed to function as a phase shift layer to produce a desired phase shift (e.g., $\pi$). In addition, the combined phase shift produced by both phase shifter layers and the etch stop layer is an even multiple of $\pi$ (e.g., $2\pi$).

In an illustrative embodiment the method of the invention is used to form an alternating aperture phase shift mask. The method of the invention can also be used to form rim phase shifting masks and chromeless phase shift masks. Once formed the mask can be used in semiconductor manufacture to form integrated circuits having very small features.

BRIEF DESCRIPTION OF THE DRAWINGS

FIGS. 5A–5E are schematic cross sectional views illustrating a specific example for forming an alternating aperture phase shifting mask; and FIGS. 6A–6G are schematic cross sectional views illustrating a specific example for forming a chromeless phase shifting mask.

DETAILED DESCRIPTION OF THE PREFERRED EMBODIMENT

Figure 3A:
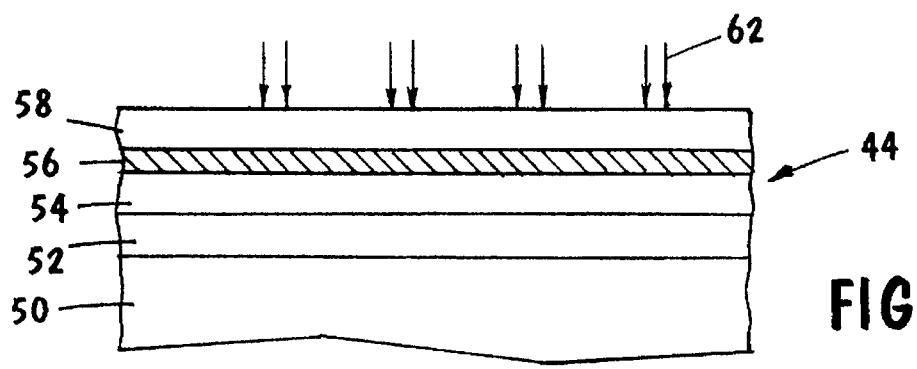
FIGS. 3A–3H are schematic cross sectional views illustrating the formation of an alternating aperture phase shift mask in accordance with the method of the invention.

As used herein, the terms "mask" and "reticle" are interchangeable. Referring now to FIG. 3A, a mask blank 44 includes: a substrate 50; an etch stop layer 52; a phase shift layer 54; and an opaque layer 56. Depending on manufacturing requirements, the mask blank 44 can be formed with a size and peripheral configuration similar to those of a target, such as a semiconductor wafer. Preferably, the features ultimately formed on the mask blank 44 can be made larger than desired on the target by employing a reduction lens between the mask and target (e.g., 2×, 5×, 10×) during a subsequent lithographic process using the mask.

The substrate 50 is formed of a material that is transparent to light or other exposure energy (e.g., x-ray, electron beam) at an exposure wavelength (e.g., 248 nm). Quartz (fused silica) is one material that can be used to form the substrate 50. Alternately, other transparent materials having suitable optical, mechanical and chemical properties can be used. As an example, for 193 nm lithography, $Al_2O_3$ could be used in place of quartz.

The etch stop layer 52 is deposited on the surface of the substrate 50. The phase shift layer 54 is deposited on the surface of the etch stop layer 52. The etch stop layer 52 is formed of a material that is chemically different than the phase shift layer 54. As an example, for a quartz substrate 50, the etch stop layer 52 can be formed as a fluoride (e.g., $MgF_2$, $CaF_2$, $YF_3$, $LaF_3$) or as a mixture of silicon dioxide and aluminum oxide (i.e., $xSiO_2+(1-x)Al_2O_3$). These materials have a refractive index that closely matches that of quartz and have a low absorption at exposure wavelengths commonly used for optical lithography. Additionally, the above identified materials can be blanket conformably deposited to a precise thickness using suitable deposition processes such as chemical vapor deposition (CVD), plasma-enhanced chemical vapor deposition (PECVD) or sputtering. With the etch stop layer 52 formed of one of these materials, the phase shift layer 54 can be formed of an oxide such as silicon dioxide ($SiO_2$).

As will be further explained, the different chemical compositions of the phase shift layer 54 and the etch stop layer 52 permits the etch stop layer 52 to function as an etch stop during a subsequent etch process for etching defects from the phase shift layer 54.

The phase shift layer 54 is formed with a thickness ($t_1$) and index of refraction ($n_1$) to provide a phase shift ($\emptyset_1$) which is preferably 180° ($\pi$) or odd integral multiple thereof. The thickness ($t_1$) for the shift layer 54 can be determined by the well known formula:

$$t = i\lambda/2(n-1)$$

where t=thickness i=an odd integer

λ=wavelength of exposure light n=refractive index of phase shift material at the exposure wavelength.

Unless the optional indentation defect removal step is performed, the etch stop layer 52 does not need to produce a phase shift. In this case the etch stop layer 52 can be made very thin (e.g., 500 Å).

If the optional indentation removal step is performed then the etch stop layer 52 can be formed with a thickness ($t_2$) and an index of refraction ($n_2$) to produce a predetermined phase shift ($\emptyset_2$) of preferably $\pi$ (180°). In addition with the optional indentation removal step, the etch stop layer 52 and phase shift layer 54 can be formed with thicknesses and indexes of refraction to provide a combined phase shift of $2\pi$. With the optional indentation removal step, the values for the phase shifts $\emptyset_1$ and $\emptyset_2$ (at the optical wavelength of $\pi$) can be expressed by the formulas $\emptyset_1=(2a+1)\pi$ and $\emptyset_2=(2b+1)\pi$ where a and b are integers, preferably both equal to zero. In addition, with the optional step, the sum of the phase shifts for the etch stop layer 52 and the phase shift layer 54 is equal to $2\pi$ or integral multiple thereof. Stated mathematically the relationship is: $(\emptyset_1+\emptyset_2)=2p\pi$, where p is an integer.

Following formation of the etch stop layer 52 and phase shift layer 54 on the substrate 50, an opaque layer 56 is formed on the phase shift layer 54. The opaque layer 56 is preferably formed of a material that is highly opaque at wavelengths used in lithography. Exemplary materials include: chromium; chrome; mixtures of chromium, oxygen and nitrogen; and mixtures of molybdenum, silicon, oxygen and nitrogen. The opaque layer 56 can be blanket conformally deposited using a deposition process such as CVD or sputtering.

Following deposition of the opaque layer 56, a layer of resist 58 is formed on the opaque layer 56 such as by spin deposition. In the illustrative embodiment, this is a positive tone resist. The layer of resist 58 is then exposed using exposure radiation 62 directed through a mask pattern (not shown). A preferred method of exposing the resist 58 in a desired pattern is with an electron beam mask writer. An exemplary electron beam resist is polybutene (PBS) supplied by DuPont photoblanks division of Poughkeepsie, N.Y. A suitable E-beam mask writer for forming the mask blank 44 is manufactured by Cambridge and is designated an EBMF 10.5 e-beam system. Another suitable e-beam system is a MEBES™ 4500 mask writer sold by ETEC Systems, Inc. 26460 Corporate Ave., Hayward, Calif. 94545.

Figure 3B:
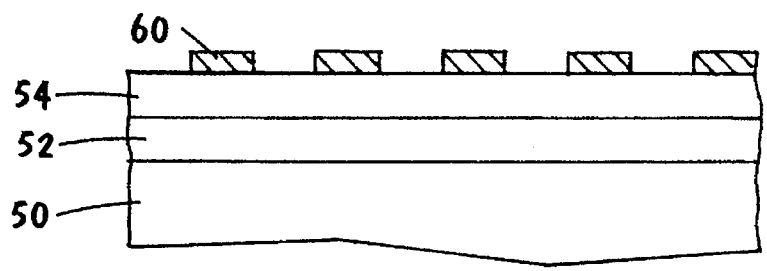

Following exposure, the layer of resist 58 is developed using a suitable developer. As shown in FIG. 3B, the developed layer of photoresist 58 is used to etch the opaque layer 56 to form a pattern of opaque light blockers 60. Depending on the materials selected the opaque layer 56 can be etched using a suitable wet etchant.

Figure 3C:
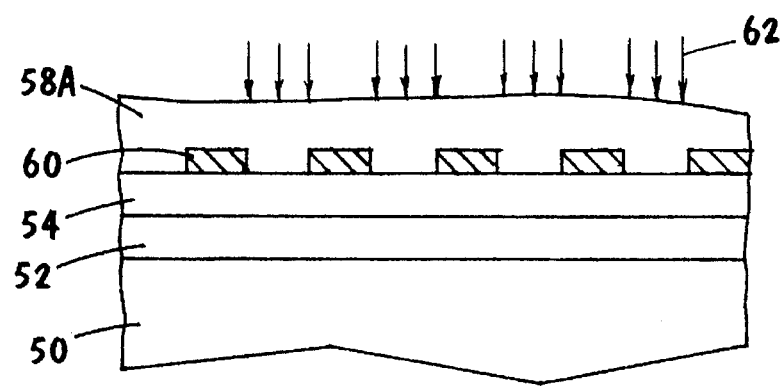
Figure 3D:
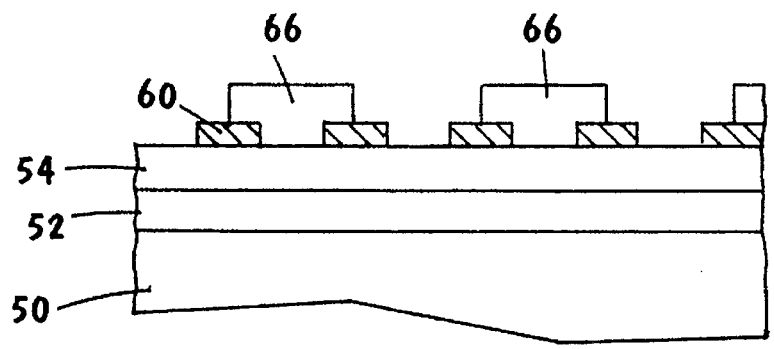

Next, as shown in FIGS. 3C and 3D, a layer of resist 58A (FIG. 3C) is deposited over the opaque light blockers 60 and over upper phase shift layer 54. The layer of resist 58A is then exposed using an exposure radiation 62, and developed to form a resist mask 66 (FIG. 3D). As before, e-beam lithography can be used to expose the resist 58A. Using a developing step the layer of resist 58A is formed into the resist mask 66 (FIG. 3E).

Figure 3E:
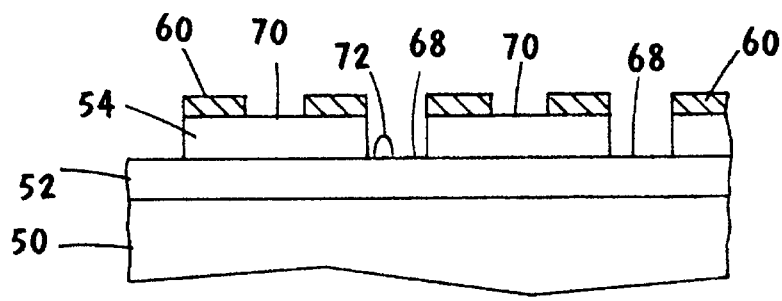

Next, as shown in FIG. 3E, the resist mask 66 (FIG. 3D) is used to etch the phase shift layer 54 to form a pattern of phase shifters 68. A suitable wet or dry etchant can be used to etch the phase shift layer 54. For a phase shift layer 54 formed of silicon dioxide and an etch layer 52 formed of a fluoride (e.g., $MgF_2$, $CaF_2$, $YF_3$, $LaF_3$) the etchant can comprise wet hydrofluoric acid or a dry fluorinated gas mixture of $CHF_3$, $CF_4$, and $O_2$. The etching of the phase shift layer 54 is terminated at the surface of the etch stop layer 52. This endpoint can be measured, estimated from the etching conditions or detected by detecting chemical species present in the etching plasma.

As also shown in FIG. 3E, the etching process can leave bump defects 72 formed of a same material as the phase shift layer 54 (e.g., $SiO_2$). These bump defects 72 are typically remnants of the phase shift layer 54 that are not completely removed by the phase shifter etching process. These bump defects 72 are the primary type of defect occurring in the fabrication of such a phase shift mask.

Figure 3F:
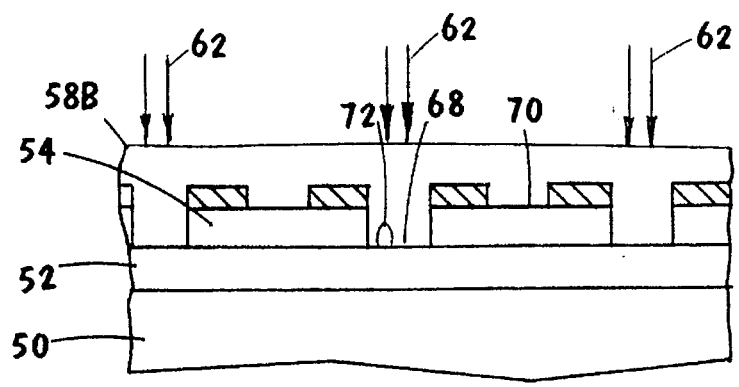

Next, as shown in FIG. 3F, a layer of resist 58B is deposited over the opaque light blockers 60 and into the phase shifters 68. The layer of resist 58B is then exposed using exposure energy 62 directed through a mask pattern (not shown). The mask pattern can be the same mask pattern that was used to form the resist mask 66 (FIG. 3D) for etching the phase shift layer 54 to form the phase shifters 68. In addition, this exposure step can be performed with e-beam lithography using an e-beam mask writer as previously described.

Figure 3G:
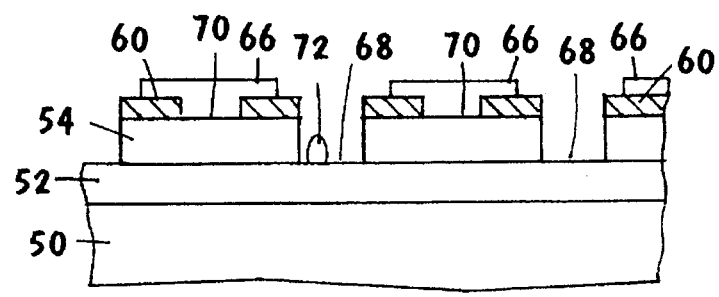

As shown in FIG. 3G, exposure and development of the resist 58B forms another resist mask 66. The resist mask 66 is then used to protect the phase shift layer 54 while the bump defects 72 are etched. In effect this is the same etch process that was originally used to etch the phase shift layer 54 to form the phase shifters 68. This etch process can be endpointed at the surface of the etch stop layer 52 as previously described.

In order to avoid undercutting of the phase shift layer 54, an anisotropic etch process is preferred for removing the defects 72. Such an anisotropic etch process can be performed using a plasma etcher and a suitable gas etchant. By way of example and not by limitation, for a phase shift layer 54 formed of $SiO_2$, the dry etch process can be performed using an SL 720 etcher manufactured by Plasma-Therm, Inc., and a gas mixture comprising $CHF_3$ at a flow rate of about 95 sccm and $O_2$ at flow rate of about 5 sccm. Other suitable etch parameters include a pressure of about 20 mTorrs, a power of about 200 W (13.56 MHz source) and an electrode spacing of about 60 mm. Variations on these parameters could also be used.

During the etch process for removing the bump defects 72, alignment of the resist mask 66 can be effected using standard alignment techniques. However, the bump defects 72 will be random and typically will not occupy the total area of the phase shifters 68. Accordingly errors in aligning the resist mask 66 can be tolerated.

Alternately, the resist 58B (FIG. 3F) can be exposed only in the areas above the defects 72. Then the resist 64 would be developed to leave the defects 72 unprotected and only the defects 72 would be etched. The exposure of the resist 58B over the defects 72 can be accomplished by ascertaining the location of the defects 72 such as with a scanning electron microscope. E-beam lithography and an e-beam mask writer could then be used as previously described to expose the resist 58B. UV lithography could also be used to expose just the defects 72 using a mask writing tool such as a model CORE 2564. A mask repair tool such as a model DRS II could also be used to expose just the defects 72.

Figure 3H:
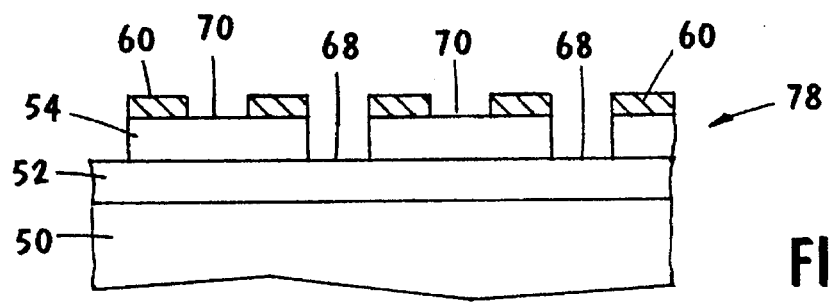

Following the etch procedure for removing the bump defects 72 the resist mask 66 is stripped. As shown in FIG. 3H, the completed mask 78 is substantially defect free and includes the opaque light blockers 60, the light transmission openings 70 and the phase shifters 68.

Figure 1:
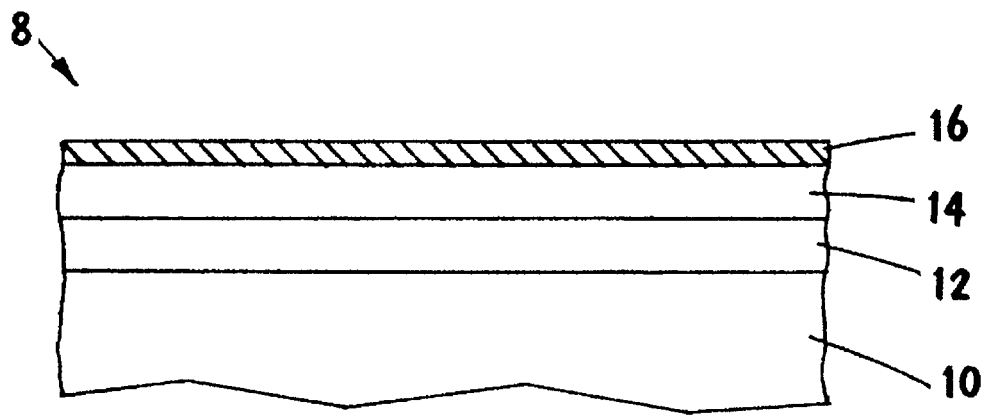
FIG. 1 is a schematic cross sectional view of a mask blank used in forming a prior art phase shift mask.
Figure 2:
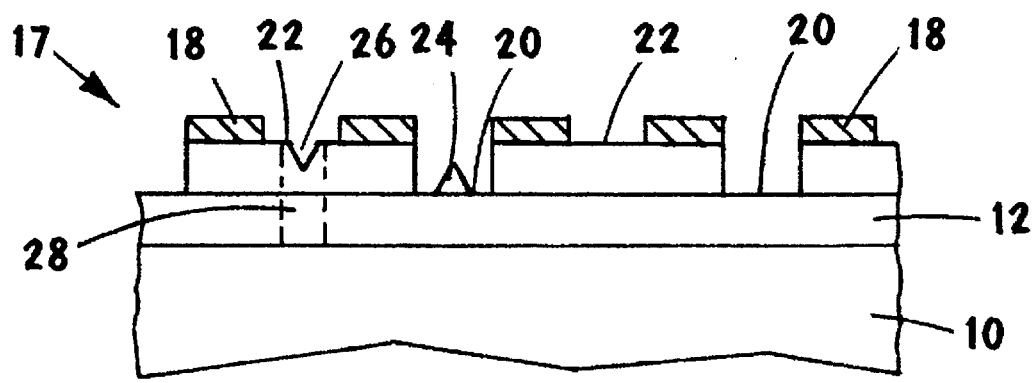
FIG. 2 is a schematic cross sectional view of a completed prior art phase shift mask illustrating bump defects and indentation defects.

As an optional additional step indentation defects (e.g., 26—FIG. 2) can be removed using a focused ion beam as outlined in the previously cited U.S. Pat. No. 5,405,721. In this case a focused gallium ion beam (not shown) is directed point by point against the area of the mask wherein the indentation defect is located. The focused ion beam can be used to ion mill the phase shift layer 54 and the etch stop layer 52 to the surface of the substrate 50. This is essentially the same process as illustrated in FIG. 3H. In this case the etch stop layer 52 and the phase shift layer 54 must be constructed to provide predetermined phase shifts as previously described.

Figure 4A:
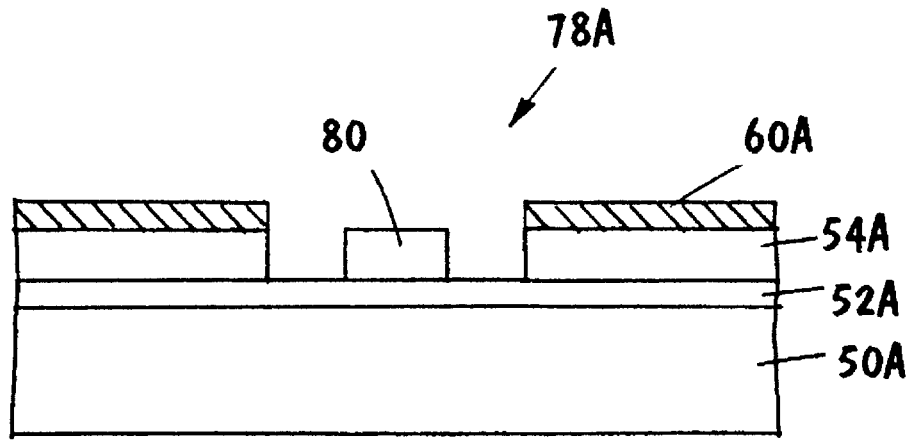
FIG. 4A is a schematic cross sectional view of a rim phase shift mask formed in accordance with the invention.

The completed mask 78 shown in FIG. 3H is an alternating aperture phase shift mask. The method of the invention can also be used to form other types of phase shift masks. FIG. 4A illustrates a rim phase shift mask 78A formed using the method of the invention. The rim phase shift mask 78A includes a substrate 50A, an etch stop layer 52A, a phase shift layer 54A and opaque light blockers 60A formed substantially as previously described. In addition the rim phase shift mask 78A includes a rim phase shifter 80 formed by etching the phase shift layer 54A to the surface of the etch stop layer 52A. This is essentially the same etch procedure previously described for forming the phase shifters 68. However, in this case the rim phase shifter 80 is formed as an island between adjacent opaque light blockers 60A.

Figure 4B:
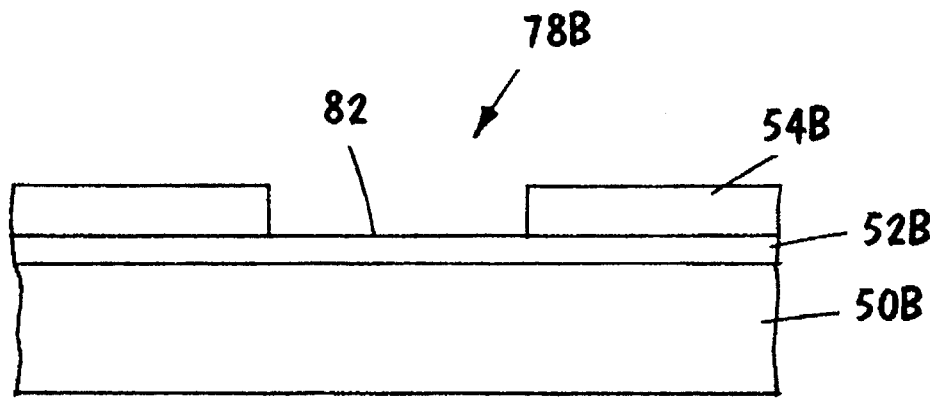
FIG. 4B is a schematic cross sectional view of a chromeless phase shift mask formed in accordance with the invention.

FIG. 4B illustrates a chromeless phase shift mask 78B formed using the method of the invention. The chromeless phase shift mask 78B includes a substrate 50B, an etch stop layer 52B and a phase shift layer 54B formed substantially as previously described. In addition the chromeless phase shift mask 78B includes a chromeless phase shifter 82 formed by etching the phase shift layer 54B to the surface of the etch stop layer 52B. In the case of the chromeless phase shift mask 78B a chrome layer as previously described is not required.

As will be apparent from the following examples, the method of the invention can be practiced using either an additive process or a subtractive process.

EXAMPLE

Using a mask blank formed with an etch stop layer and a phase shift layer as previously described, two types of phase shifting masks were fabricated: alternating aperture and chromeless. The fabrication process for the alternating aperture mask is described in FIGS. 5A–5F. In FIG. 5A, a mask blank 76 includes a quartz substrate 50C, an $SiO_2$ etch stop layer 52C, a yttrium fluoride phase shift layer 54C and a chrome layer 56C. The yttrium fluoride layer 54C was deposited in an electron gun, commercial vacuum evaporator from Edwards at a pressure of 4E10—6 Torr at ambient temperature. The films were deposited on 4" mask blanks 76 having a 4" diameter.

Initially, the chrome layer 56C was patterned and etched. To pattern the chrome layer 56C, the following process conditions were used: the mask blanks 76 were coated with 0.4 micron PBS resist 58C, baked at 120 degrees C. for 30 minutes, and then exposed using a Cambridge EBMF 10.5 e-beam system at 40 keV at a dose of 6 $\mu C/cm^2$. The mask blanks 76 were developed using an APT915 with methylisoamylketone (MIAK): 2-pentanone (80:20) at 60 degrees F, 40% humidity. The mask blanks 76 were then baked in a Blue M oven at 120 degrees C. for 30 minutes, followed by a descum in a LFE501 Plasma unit for 5 seconds. The chrome layer 56C was etched in a ceric ammonium nitrate (CAN) bath at 20 degrees C. Finally, the resist 58C was stripped in a Plasma Therm SL720RIE etcher for 60 seconds ($O_2$:150 sccm, 50 mTorr, 50 W). As shown in FIG. 5B, this forms a pattern of opaque light blockers 60C.

The phase shift layer 54C was then patterned. To pattern the phase-shift layer 54C, the following processing conditions were used; the blank 76 was coated with 0.6 micron of AZ5206 resist 58CC (FIG. 5C) from Hoechst and then baked at 90 degrees C. for 30 minutes. The e-beam exposure was performed using a Cambridge EBMF 10.5 e-beam system at 40 keV at a dose of 80 $\mu C/cm^2$. The mask blanks 76 were baked in a blue M oven at 115 degrees C. for 30 minutes. As shown in FIG. 5C a backside UV exposure was then performed using an ORIEL lamp at 1000 W for 2.5 seconds. Then, the resist 58CC was developed using MF312 developer at 0.27N for 60 seconds in an APT915 to form resist mask 66C (FIG. 5D).

As shown in FIG. 5D, the blanks 76 were then descumed and dry etched in a Plasma Therm RIE etcher (descum O2:150 sccm, 50 mTorr, 50 W, 30 seconds; silicon dioxide etch $CHF_3$; 180 sccm, 20 mTorr, 200 W, time adjusted). Next, as shown in FIG. 5E the resist mask 66C was stripped (Plasma Therm SL720, O2:150 sccm, 50 mTorr, 50 W, 4 minutes). As shown in FIG. 5E the etched mask blank 76 includes phase shifters 68C. Defects can be removed from the phase shifters 68C using the dry etch parameters as previously described.

Using this process, several phase-shifting masks were fabricated and evaluated. The evaluation was conducted using 0.5 micron of CAMPG resist on silicon wafers, baked at 105 degrees C for 60 seconds. The exposures were performed on a XLS deep UV stepper, wavelength; 248 nm, NA:0.53, sigma; 0.36. After exposure, the resist was post-baked at 115 degrees C. for 60 seconds and developed using OPD262 developer, 0.26N for 60 seconds.

FIGS. 6A–6C illustrate the formation of a chromeless phase shift mask 78B. As shown in FIGS. 6A and 6B the resist is exposed 58D and the chrome is etched substantially as previously described to form opaque light blockers 60D. Next, as shown in FIG. 6C for patterning the phase shift layer 54D only the backside flood UV exposure is performed to form resist mask 58DD. Next, as shown in FIG. 6D the phase shift layer 54D is etched to form rim phase shifters 68D. As shown in FIG. 6E, the mask blank 78B is then cleaned, recoated with a third resist layer 58DDD and exposed to form resist mask 66DD (FIG. 6F). As shown in FIG. 6G, the chrome 60D covering the phase patterns is then etched to form opaque light blockers 60DD.

Thus the invention provides an improved method for forming defect-free phase shifting mask and for using such a mask for semiconductor manufacture. While the invention has been described with reference to certain preferred embodiments, as will be apparent to those skilled in the art, certain changes and modifications can be made without departing from the scope of the invention as defined by the following claims.

What is claimed is:

1. A method for forming a phase shift mask comprising:

providing a transparent substrate;

forming a first layer on the substrate;

forming a phase shift layer on the first layer out of a material that is chemically different than a material of the first layer;

forming a pattern of opaque light blockers on the phase shift layer;

etching the phase shift layer to form a pattern of phase shifters;

depositing a layer of resist on the phase shift layer and exposing and developing the resist to form a mask having openings aligned with the phase shifters; and etching through the openings in the mask to the first layer to remove a bump defect on the phase shift layer.

2. The method as claimed in claim 1 and wherein the mask is exposed using a same mask pattern as used for etching the phase shift layer to form the phase shifters.

3. The method as claimed in claim 1 and wherein the first layer is a thin film having a thickness that is not selected to provide a desired phase shift for light passing there through.

4. The method as claimed in claim 1 and further comprising forming the first layer as a second phase shift layer and removing an indentation defect by removing the first layer subjacent to the indentation defect to the substrate.

5. The method as claimed in claim 1 and wherein the first layer and phase shift layer are formed with indexes of refraction and thicknesses to provide a combined phase shift of $2p\pi$ where p is an integer.

6. The method as claimed in claim 1 and wherein the first layer has a thickness of less than 500 Å.

7. The method as claimed in claim 1 and wherein the first layer is formed of a fluoride and the phase shift layer is formed of an oxide.

8. The method as claimed in claim 7 and wherein the substrate is formed of quartz and the phase shift layer is formed of $SiO_2$ and the first layer is formed of a material selected from the group consisting of $MgF_2$, $CaF_2$, $YF_3$, and $LaF_3$.

9. The method as claimed in claim 1 and wherein the etching step for removing the defects is an anisotropic dry etch process.

10. The method as claimed in claim 9 and wherein the defect is etched to an endpoint of the first layer by detecting by-product species present in an etch plasma.

11. The method as claimed in claim 1 and wherein the layer of resist is exposed and developed to leave the phase shifters substantially exposed.

12. The method as claimed in claim 1 and wherein the layer of resist is exposed and developed to leave just the defect substantially exposed.

13. The method as claimed in claim 1 and further comprising using the mask to expose a second layer of resist formed on a semiconductor wafer.

14. The method as claimed in claim 1 and wherein the mask is selected from the group consisting of alternating aperture phase shift masks and rim phase shift masks.

15. A method for forming a phase shifting mask comprising:

providing a transparent substrate;

forming an etch stop layer and a phase shift layer on the substrate;

depositing, exposing, and developing a first layer of resist to form a first mask for etching the phase shift layer to an endpoint of the etch stop layer to form phase shifters;

depositing a second layer of resist over the phase shifters;

exposing and developing the second layer of resist to form a second mask with openings aligned with the phase shifters; and removing bump defects on the phase shifters by etching through the openings in the second mask to an endpoint of the etch stop layer.

16. The method as claimed in claim 15 and wherein the etch stop layer and the phase shift layer are each formed with a thickness and index of refraction to provide a phase shift of $\pi$ or odd multiple thereof, and a combined phase shift of $2p\pi$ where p is an integer.

17. The method as claimed in claim 16 and further comprising removing indentation defects from the mask by removing the phase shift layer and the etch stop layer in an area surrounding the indentation defect to the substrate.

18. The method as claimed in claim 17 and wherein the substrate is formed of quartz, the phase shift layer is formed of $SiO_2$ and the etch stop layer is formed of a material selected from the group consisting of $MgF_2$, $CaF_2$, $YF_3$, $LaF_3$.

19. The method as claimed in claim 15 and wherein the mask is a chromeless phase shift mask.

20. The method as claimed in claim 15 and further comprising forming an opaque layer on the phase shift layer and patterning the opaque layer to form opaque light blockers.

21. The method as claimed in claim 20 and wherein the opaque layer and phase shift layer are patterned to form an alternating aperture phase shifting mask.

22. The method as claimed in claim 20 and wherein the opaque layer and phase shift layer are patterned to form a rim phase shifting mask.

23. A method for forming a phase shift mask comprising:

providing a transparent substrate;

forming an etch stop layer on the substrate out of a first material;

forming a phase shift layer on the etch stop layer out of a second material that is chemically different than the first material;

patterning the opaque layer by exposing and developing a first layer of resist to form a first mask for etching the opaque layer to form opaque light blockers;

patterning the phase shift layer by exposing and developing a second layer of resist to form a second mask for etching the opaque layer to the etch stop layer to form phase shifters;

removing bump defects on the phase shifters by exposing and developing a third layer of resist using a same pattern as the second mask to form a third mask for etching the bump defects.

24. The method as claimed in claim 23 and wherein etching the bump defects is performed anisotropically to avoid undercutting the phase shifters.

25. The method as claimed in claim 23 and wherein phase shift layer is formed of $SiO_2$ and the etch stop layer is formed of a material selected from the group consisting of $MgF_2$, $CaF_2$, $YF_3$, $LaF_3$.

26. The method as claimed in claim 23 and wherein the substrate is formed of a material selected from the group consisting of quartz and $Al_2O_3$.

27. The method as claimed in claim 23 and wherein the first and second layers of resist are exposed using electron beam lithography.

28. The method as claimed in claim 27 and wherein the third layer of resist is exposed using a mask repair tool.

29. The method as claimed in claim 23 and further comprising removing an indentation defect from the mask by removing the phase shift layer and the etch stop layer in an area surrounding the indentation defect to the substrate.

30. The method as claimed in claim 23 and wherein the etch stop layer and phase shift layer are formed with indexes of refraction and thicknesses to provide a combined phase shift of $2p\pi$ where p is an integer.

31. The method as claimed in claim 23 and further comprising using the mask to pattern a semiconductor wafer coated with a fourth layer of resist.

32. A method for forming a phase shift mask comprising:

providing a transparent substrate;

forming an etch stop layer and a phase shift layer on the substrate;

forming a pattern of opaque light blockers on the phase shift layer;

etching the phase shift layer to the etch stop layer to form a pattern of phase shifters;

locating bump defects on the phase shifters;

depositing a layer of resist on the phase shift layer;

exposing and developing the resist to form a mask having openings aligned with the defects; and etching through the openings in the mask to the etch stop layer to remove the defects.

33. The method as claimed in claim 32 and wherein exposing the resist is with an e-beam mask writer.

34. The method as claimed in claim 32 and wherein exposing the resist is with a mask writing tool.

35. The method as claimed in claim 32 and wherein locating the defects is with a scanning electron microscope.

* * * * *